(12) United States Patent
Takahashi (10) Patent No.: US 7,525,326 B2
(45) Date of Patent: Apr. 28, 2009

(54) TEST APPARATUS CAPABLE OF ACCURATELY CONNECTING A TEST OBJECT TO A SUBSTRATE

(75) Inventor: Takeshi Takahashi, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 22 days.

(21) Appl. No.: 11/449,339

(22) Filed: Jun. 8, 2006

(65) Prior Publication Data
US 2006/0279317 A1    Dec. 14, 2006

(30) Foreign Application Priority Data
Jun. 10, 2005  (JP) ............... 2005-170734

(51) Int. Cl.
G01R 31/02 (2006.01)
G01R 31/28 (2006.01)
(52) U.S. Cl. .................... 324/754; 324/158.1
(58) Field of Classification Search ............. 324/754
See application file for complete search history.

(56) References Cited

U.S. PATENT DOCUMENTS

| | | | | |
|---|---|---|---|---|
| 4,906,920 A | * | 3/1990 | Huff et al. ............ | 324/754 |
| 4,943,768 A | * | 7/1990 | Niki et al. ............ | 324/754 |
| 5,408,189 A | * | 4/1995 | Swart et al. ........... | 324/758 |
| 5,489,853 A | * | 2/1996 | Nakajima ............. | 324/754 |
| 5,568,056 A | * | 10/1996 | Ishimoto ............. | 324/754 |
| 5,675,261 A | * | 10/1997 | Lee .................. | 324/754 |
| 5,795,172 A | * | 8/1998 | Shahriari et al. ....... | 439/260 |
| 5,924,887 A | | 7/1999 | Aoyama et al. | |
| 6,265,887 B1 | * | 7/2001 | Barringer et al. ....... | 324/755 |
| 6,873,145 B2 | | 3/2005 | Belmont et al. | |
| 7,084,654 B2 | * | 8/2006 | Zhao et al. ............ | 324/754 |

FOREIGN PATENT DOCUMENTS

| | | |
|---|---|---|
| CN | 2155571 | 2/1994 |
| CN | 1184346 | 6/1998 |
| CN | 1386198 | 12/2002 |
| CN | 1474945 | 2/2004 |
| JP | B H7-19812 | 10/1988 |

OTHER PUBLICATIONS

Chinese Office Action dated Jul. 18, 2008 with English translation of same.

* cited by examiner

Primary Examiner—Ha Tran T Nguyen
Assistant Examiner—Karen M Kusumakar
(74) Attorney, Agent, or Firm—Collard & Roe, P.C.

(57) ABSTRACT

In a test apparatus for testing a test object, a connector is held by an inner frame of the test apparatus and electrically connected to a substrate. A pusher is slidably held by the inner frame. The pusher has an insertion slot for receiving the test object. The pusher and the inner frame cooperates with each other to position the test object at a position corresponding to the connector. The pusher moves to bring the test object into contact with the connector.

8 Claims, 10 Drawing Sheets

TEST APPARATUS CAPABLE OF ACCURATELY CONNECTING A TEST OBJECT TO A SUBSTRATE

This application claims priority to prior Japanese patent application JP 2005-170734, the disclosure of which is incorporated herein by reference.

BACKGROUND OF THE INVENTION

This invention relates to a test apparatus for testing electric characteristics of a test object such as a flexible circuit board which is generally called a flexible printed circuit (FPC).

For example, Japanese Patent Publication (JP-B) No. H7-19812 discloses a test apparatus for testing a semiconductor device or a LCD (Liquid Crystal Display) which has a number of electrodes arranged at a fine pitch. The test apparatus comprises an insulating film provided with a plurality of contacting portions. The contacting portions comprise a plurality of conductive wires formed as probes. Upon carrying out a testing operation, the contacting portions are brought into contact with the electrodes of the substrate to test electric characteristics of the substrate. In order to indicate relative positioning between the electrodes of the substrate and the contacting portions of the insulating film, the insulating film is provided with a marking.

In case where the pitch is relatively large at the electrodes of the substrate and at the contacting portions of the insulating film, positioning therebetween can easily and accurately performed by visual observation.

However, if the pitch is extremely small, it is difficult to accurately position the electrodes of the substrate and the contacting portions of the insulating film with respect to each other.

SUMMARY OF THE INVENTION

It is therefore an object of this invention to provide a test apparatus capable of accurately connecting a test object to a substrate.

It is another object of this invention to provide a test apparatus capable of simply and easily executing a testing operation.

Other objects of the present invention will become clear as the description proceeds.

According to an aspect of the present invention, there is provided a test apparatus for testing a test object, the test apparatus comprising a substrate, an inner frame coupled with the substrate, a connector held by the inner frame and electrically connected to the substrate, and a pusher slidably held by the inner frame and having an insertion slot for receiving the test object, the pusher and the inner frame cooperating with each other to position the test object at a position corresponding to the connector, the pusher moving to bring the test object into contact with the connector.

DESCRIPTION OF THE PREFERRED EMBODIMENTS

Figure 1:
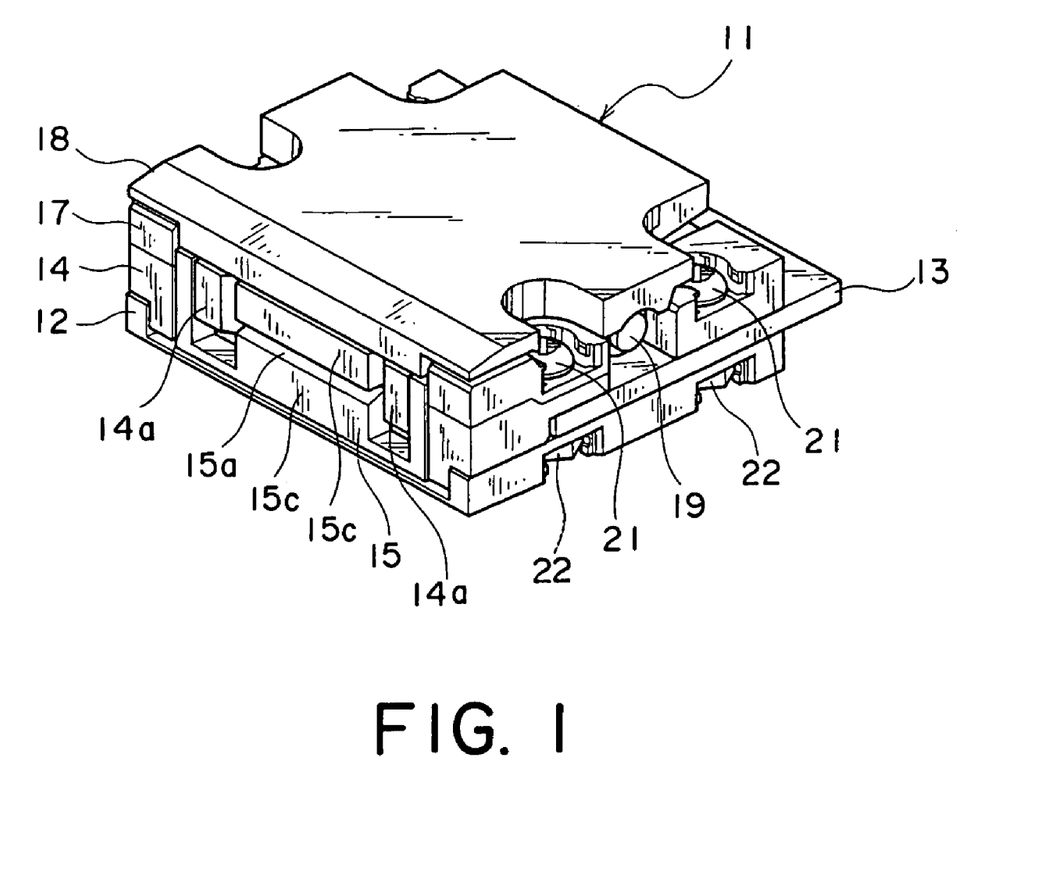
FIG. 1 is a perspective view of an external appearance of a test apparatus according to a first embodiment of this invention.
Figure 2:
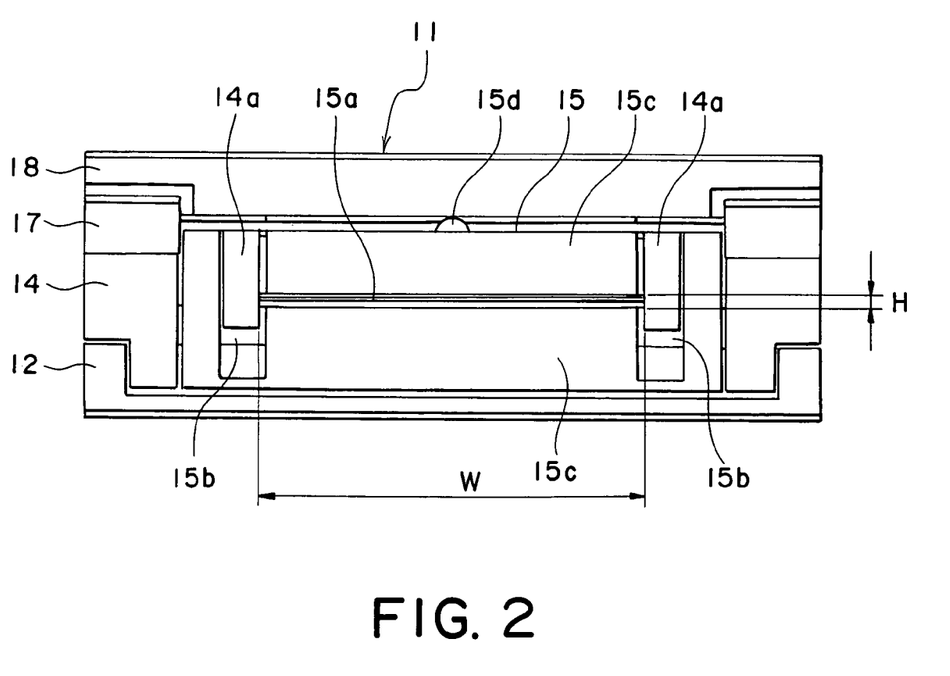
FIG. 2 is an enlarged front view of the test apparatus in FIG. 1.
Figure 3:
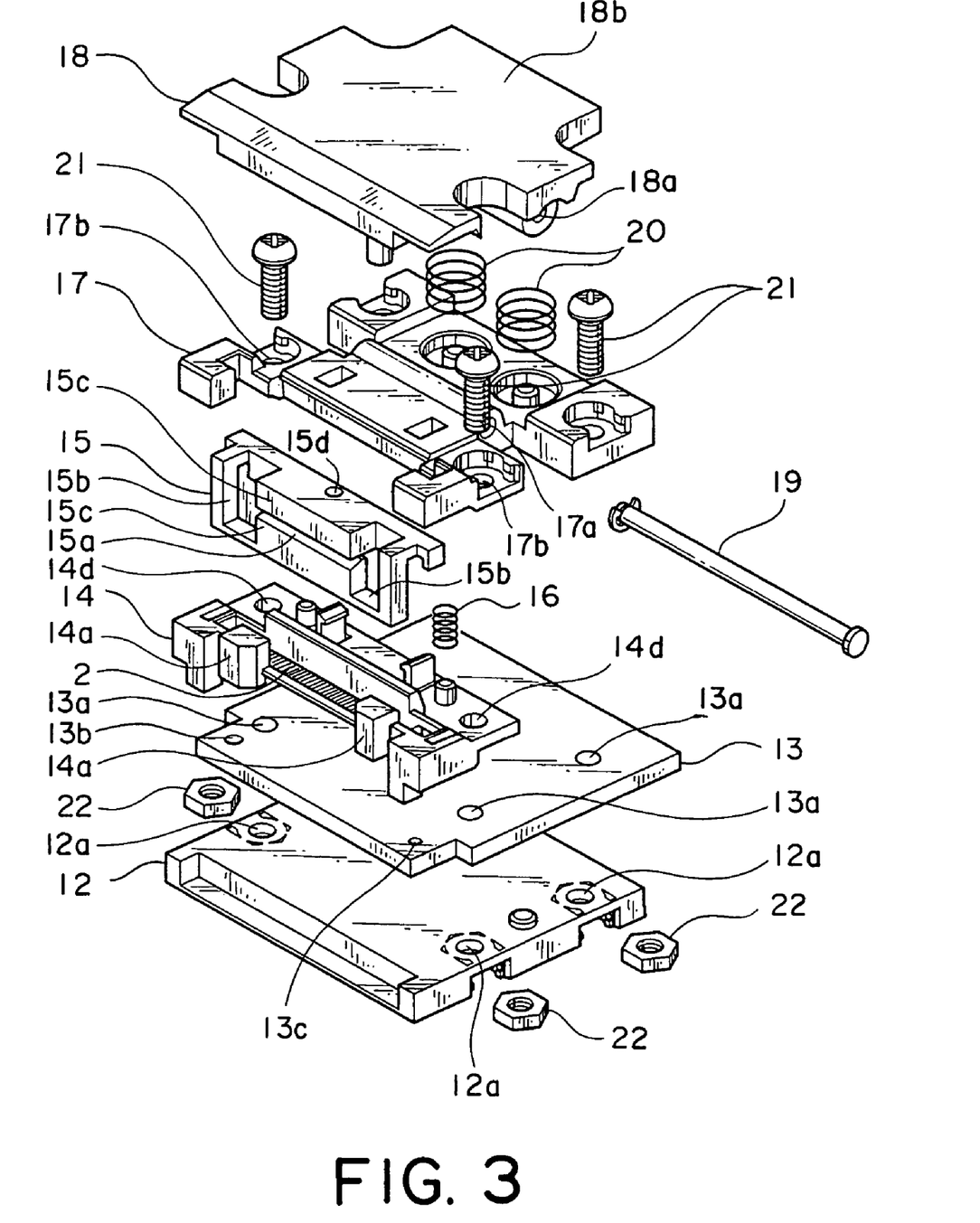
FIG. 3 is an exploded perspective view of the test apparatus in FIG. 1.

At first referring to FIGS. 1 through 3, description will be made of a whole of a test apparatus according to a first embodiment of this invention.

The test apparatus illustrated in the figure is also called a test probe and is adapted to test electric characteristics of a FPC as a test object. The test apparatus or test probe 11 comprises a bottom cover 12 also serving as a support member, a substrate 13 mounted on the bottom cover 12, an inner frame 14 mounted on the substrate 13, a pusher 15 movable in a vertical direction along the bottom cover 12, the substrate 13, and the inner frame 14, a base 17 mounted on the substrate 13 and the inner frame 14, and a top cover 18 attached to the base 17 to be rotatable around a shaft 19.

The inner frame 14 has a pair of pusher guides 14a spaced from each other with a gap W. The gap W is equal to, for example, 15.6 mm taking the width of the FPC into consideration.

The pusher 15 performs vertical movement guided by the pusher guides 14a inserted into guide holes 15b and is urged upward by a pair of lifting coil springs 16. The pusher 15 has a pair of upper and lower guides 15c faced to each other. The vertical guides 15c define an insertion slot 15a formed at a position corresponding to the gap W of the inner frame 14 to receive the FPC. The insertion slot 15a has a narrowest portion having a height H which is equal to, for example, 0.5 mm taking the thickness of the FPC into consideration.

The base 17 and the top cover 18 have shaft holes 17a and 18a for inserting the shaft 19, respectively. The shaft 19 is inserted through the shaft holes 17a and 18a so that the top cover 18 is attached to the base 17. The base 17 with the top cover 18 attached thereto is fixed to the bottom cover 12 together with the substrate 13 and the inner frame 14 by the use of four bolts 21 and four nuts 22. The bolts 21 are inserted into through holes 17b, 14d, 13a, and 12a formed in the base 17, the inner frame 14, the substrate 13, and the bottom cover 12, respectively, and are engaged with the nuts 22. The top cover 18 is urged by a pair of closing coil springs 20 in a closing direction.

Figure 4A:
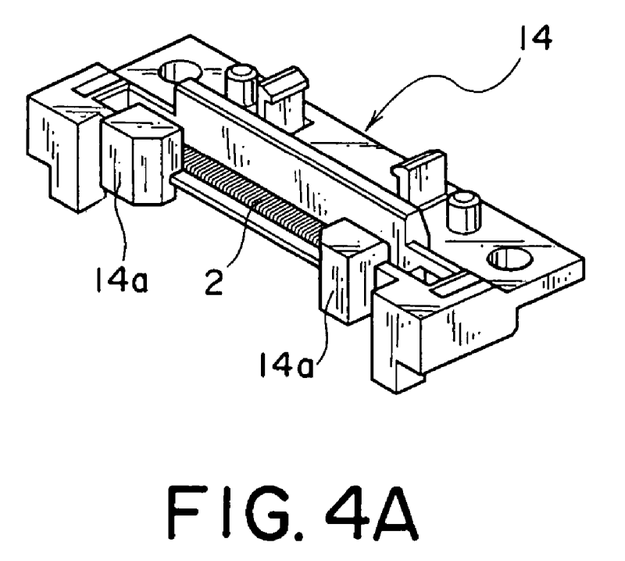
FIGS. 4A and 4B are perspective views of a combination of an inner frame and a low-contact-pressure connector in the test apparatus in FIG. 1 as seen in different directions.
Figure 4B:
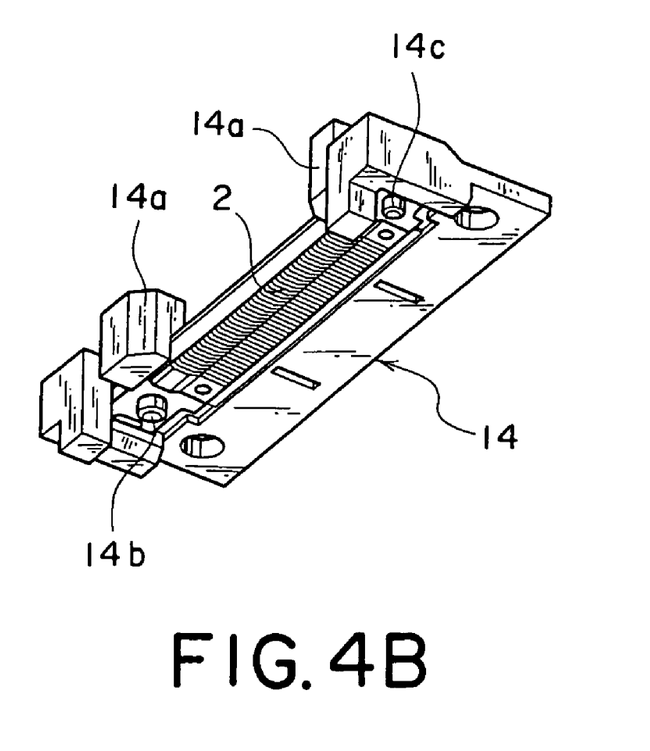

Referring to FIGS. 4A and 4B, the inner frame 14 will be described.

The inner frame 14 is provided with a large protrusion 14b and a small protrusion 14c formed on a bottom surface thereof. By the use of the protrusions 14b and 14c, a low-contact-pressure connector 2 which will later be described is positioned. Specifically, the low-contact-pressure connector 2 comprises a core member 5 provided with a large hole 5a and a small hole 5b formed on opposite sides thereof. The large hole 5a and the small hole 5b are fitted over the large protrusion 14b and the small protrusion 14c of the inner frame 14, respectively. Further, the protrusions 14b and 14c are fitted to fitting holes 13b and 13c formed in the substrate 13. Thus, the low-contact-pressure connector 22 is securely fixed between the substrate 13 and the inner frame 14.

Figure 5A:
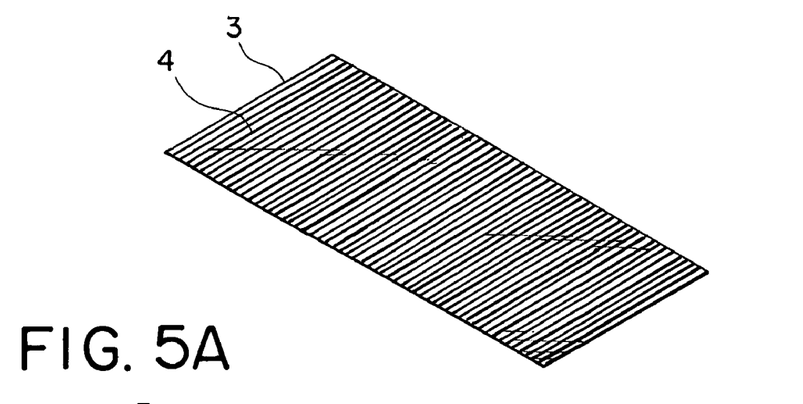
FIGS. 5A to 5C are perspective views for describing the low-contact-pressure connector illustrated in FIGS. 4A and 4B together with a method of producing the same.
Figure 5B:
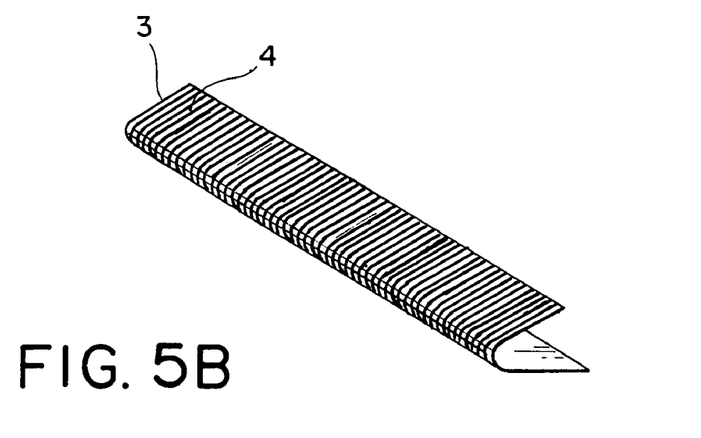
Figure 5C:
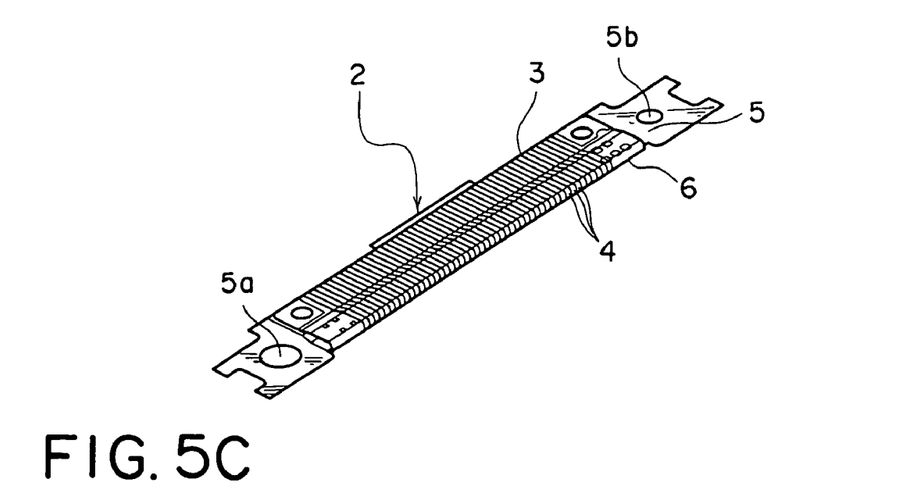

Referring to FIGS. 5A to 5C, the low-contact-pressure connector 2 will be described together with a production process thereof.

At first, a thin film 3 having a thickness of several microns is prepared. As illustrated in FIG. 5A, on one surface of the film 3, a number of conductors 4 are patterned by sputtering, etching, or plating. Thereafter, as illustrated in FIG. 5B, the film 3 is folded into two with the conductors 4 exposed outside.

On the other hand, the core member 5 is made of polyimide or the like. At a part of each of opposite surfaces of the core member 5, an elastic layer 6 of silicone rubber or the like is formed. The film 3 is combined with the core member 5 so that the film 3 folded into two sandwiches the elastic layers 6 and the core member 5. Further, the film 3 is fixed to the elastic layers 6 by the use of double-sided adhesive tapes (not shown). Thus, the low-contact-pressure connector 2 illustrated in FIG. 5 is completed.

The low-contact-pressure connector 2 has a structure in which the conductors 4 are formed on the surface of the film 3 sandwiching the elastic layers 6. Therefore, even under a low contact pressure, electrical connection can be established by surface contact or multi-point contact. Further, even if some foreign matters are interposed, electrical connection can be accomplished. Because of the low contact pressure, electrodes on the FPC 31 or the substrate 13 are prevented from being damaged. Further, because the film 3 is used, the low-contact-pressure connector 2 can be formed into a low profile.

Referring to FIGS. 6 to 9, description will be made of a method of testing the FPC 31 by the use of the test probe 11.

Figure 6:
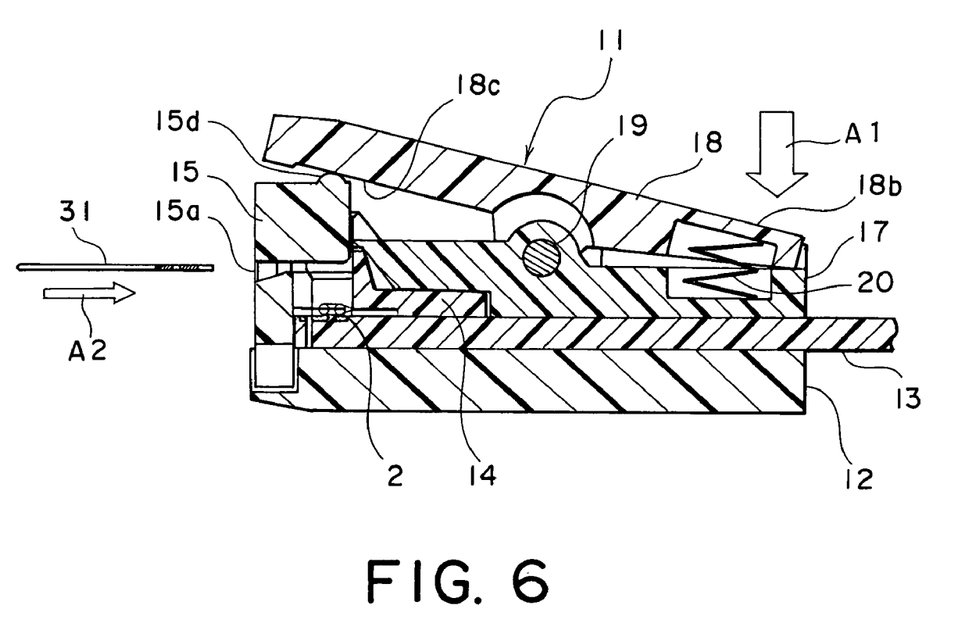
FIG. 6 is a sectional view showing the test apparatus in FIG. 1 before a FPC is inserted therein.

In FIG. 6, an operating portion 18b of the top cover 18 is pushed by a finger in a direction depicted by an arrow A1. Then, the top cover 18 is rotated clockwise around the shaft 19 to compress an elastic member consisting of the closing coil springs 20. At this time, the pusher 15 is lifted upwards by an elastic member consisting of the lifting coil springs 16 so that a protrusion 15d of the pusher 15 follows a contacting portion 18c of the top cover 18. In this state, the FPC 31 is inserted horizontally into the insertion slot 15a of the pusher 15 in a direction depicted by an arrow A2. At this time, the inner frame 14 and the pusher 15 cooperate with each other to guide insertion of the FPC 31 and to position the FPC 31. Therefore, positioning by visual observation is unnecessary so that the testing operation is easy and positioning is accurate.

Figure 7:
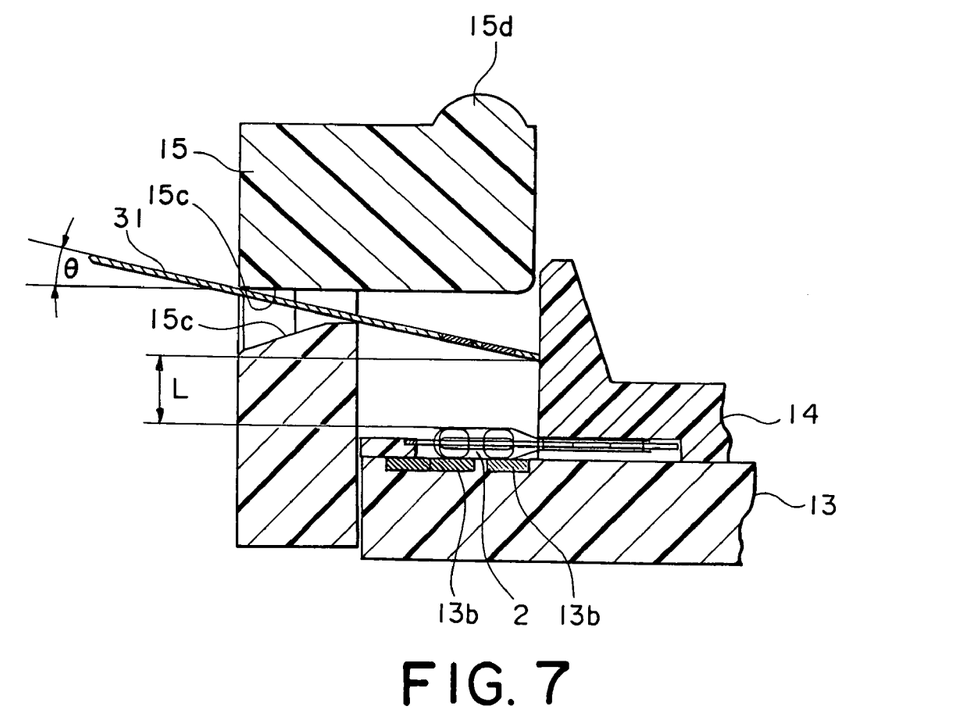
FIG. 7 is an enlarged sectional view of a characteristic part of the test apparatus in FIG. 1 with the FPC inserted therein.

When the FPC 31 is inserted into the insertion slot 15a of the pusher 15, it is assumed that the FPC 31 is inclined by an angle θ with respect to a horizontal direction as shown in FIG. 7. The upper and the lower guides 15c are designed so that, even in such event, a forward end of the FPC 31 is separated by a distance L from the low-contact-pressure connector 2. Specifically, the lower guide 15c is provided with a portion having a generally triangular section so that L≧1 mm even if θ=about 12°. With this structure, it is possible to prevent the forward end of the FPC 31 from being brought into contact with the low-contact-pressure connector 2 when the FPC 31 is inserted. Therefore, the possibility of damaging the low-contact-pressure connector 2 is reduced so that the frequency of repairing and exchanging operations of the low-contact-pressure connector 2 is reduced.

Figure 8:
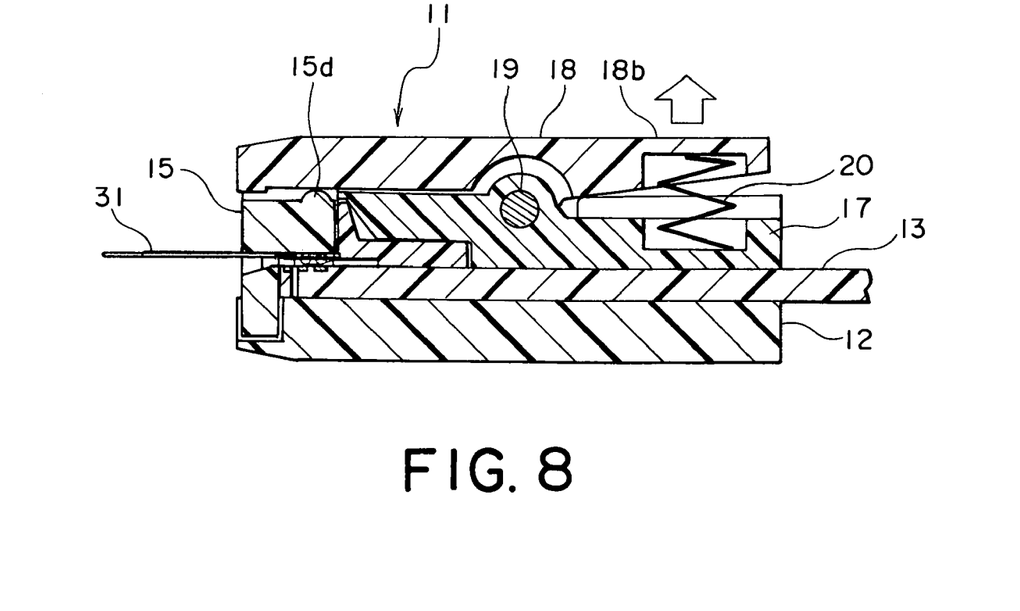
FIG. 8 is a sectional view of the test apparatus in FIG. 1 when the FPC is connected thereto.
Figure 9:
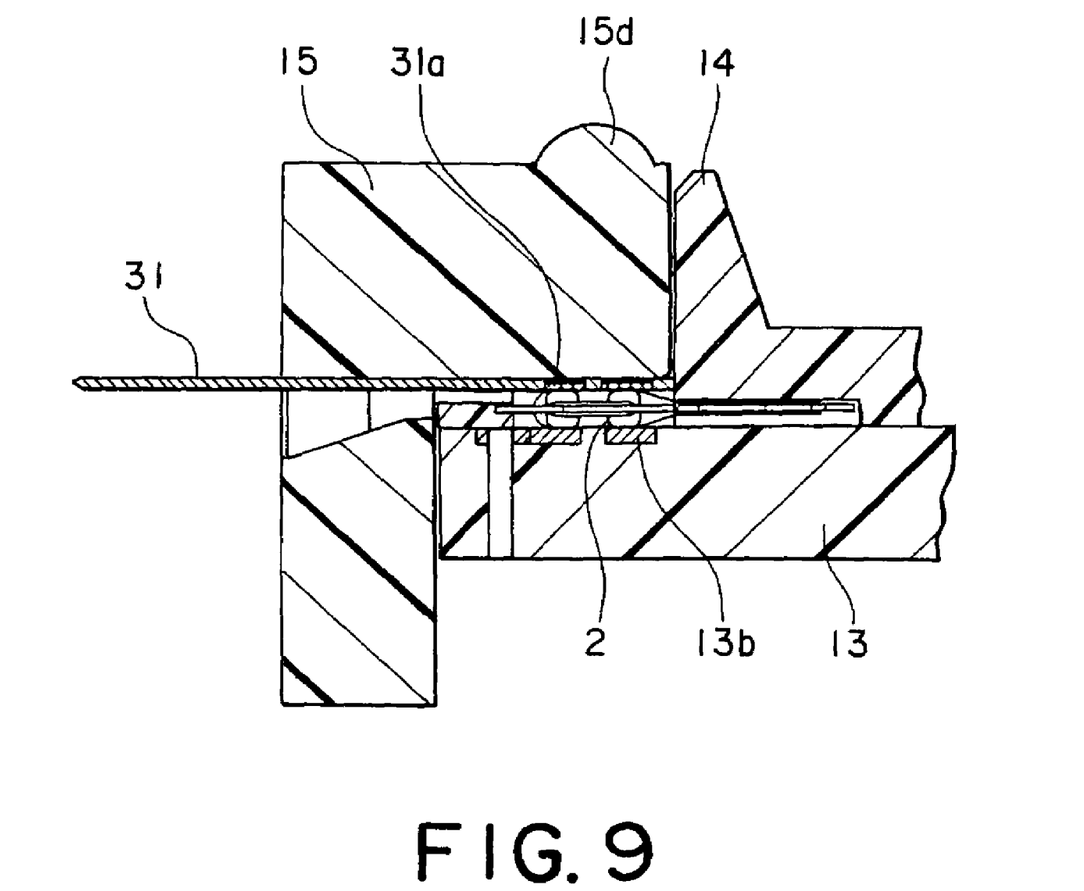
FIG. 9 is an enlarged view of a characteristic part in FIG. 8.

Subsequently, as illustrated in FIG. 8, the finger is separated from the operating portion 18b of the top cover 18 in a direction depicted by an arrow. Consequently, the closing coil springs 20 are extended so that the top cover 18 is rotated counterclockwise around the shaft 19. Then, the pusher 15 is pushed downwards by the top cover 18 so that the lifting coil springs 16 are compressed. As seen from FIG. 9, the FPC 31 is pressed by a plane of the pusher 15 so that contact point patterns 31a formed on a bottom surface of the FPC 31 are brought into contact with contact point patterns 13b of the substrate 13 through the conductors 4 of the low-contact-pressure connector 2. Accordingly, the FPC 31 is electrically connected to the substrate 13 so that the electric characteristics of the FPC 31 can be tested.

With the above-mentioned structure, a fixing operation such as soldering is unnecessary. The repairing operation is simple and a repairing and exchanging operation time can be shortened.

Next referring to FIGS. 10 and 11, description will be made of a test apparatus according to a second embodiment of this invention. Similar parts are designated by like reference numerals and description thereof will be omitted.

The test apparatus or test probe 11 has recessed structures 17c and 12b formed at four position of the base 17 and four positions of the bottom cover 12 to be fittable to either the bolts 21 or the nuts 22. In order to insert the FPC into the insertion slot 15a, the bottom cover 12 is pressed.

Figure 10:
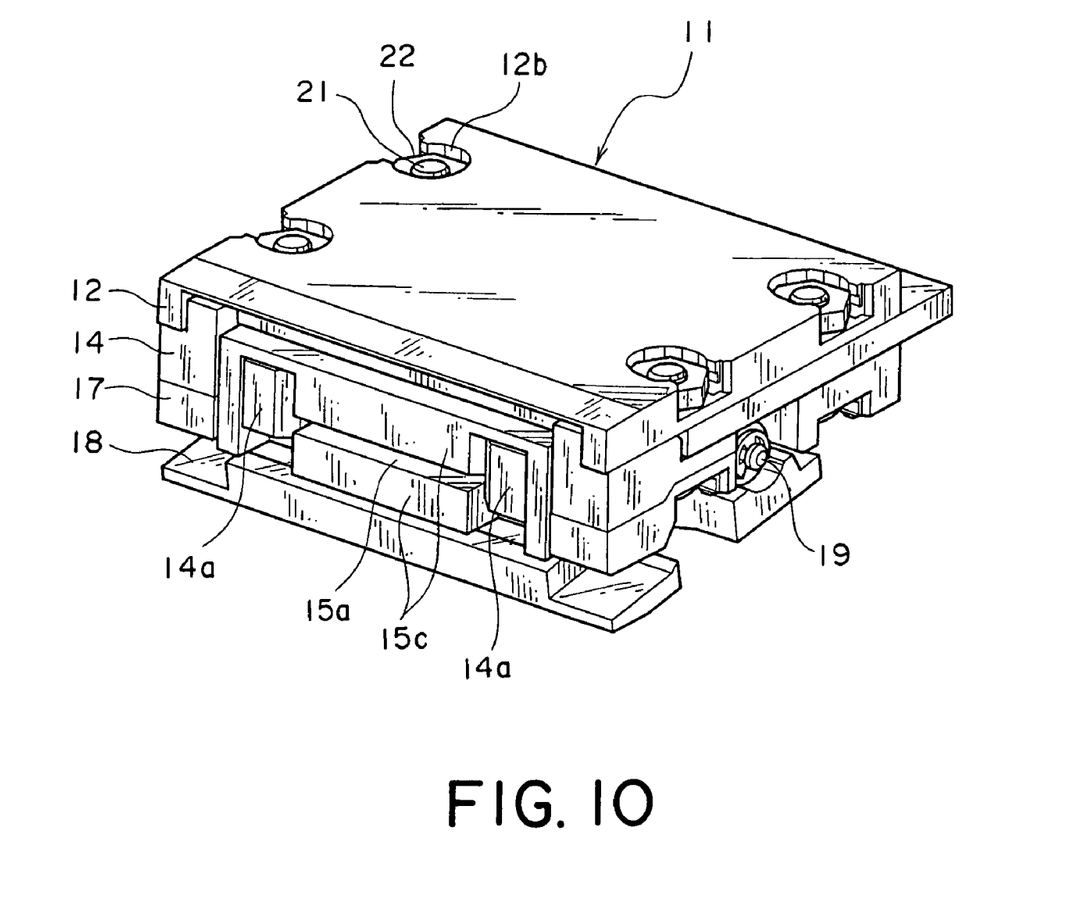
FIG. 10 is a perspective view of a text apparatus according to a second embodiment of this invention as seen from a bottom side.
Figure 11:
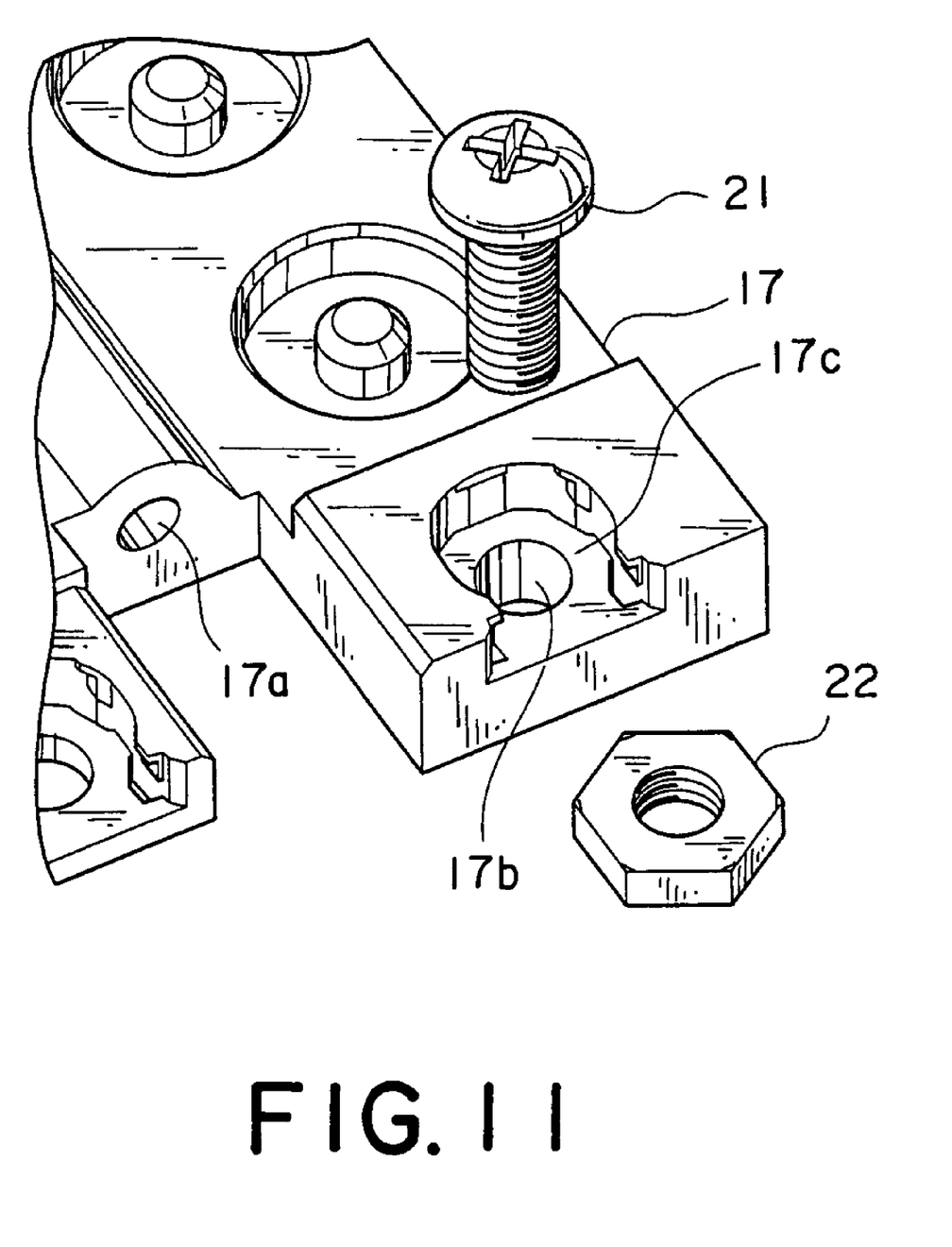
FIG. 11 is an enlarged exploded perspective view of a part of the test apparatus in FIG. 10.

With the above-mentioned structure, if the contact point patterns are formed on a top surface of the FPC, the test probe 11 is inverted in a vertical direction as shown in FIG. 10 and the bolts 21 and the nuts 22 are exchanged. Therefore, irrespective of whether the contact point patterns are formed on the top surface or the bottom surface of the FPC, the electric characteristics of the FPC can easily be tested.

Although this invention has been described in conjunction with a few preferred embodiments thereof, this invention may be modified in various other manners within the scope of the appended claims. Although the description is made as regards a case of testing the FPC, it is a matter of course that the above-mentioned test apparatus can be used for testing another test object different from the FPC.

What is claimed is:

1. A test apparatus for testing a test object, the test apparatus comprising:
   a substrate;
   an inner frame coupled with the substrate and including a pair of pusher guides spaced from each other;
   a connector held by the inner frame and electrically connected to the substrate;
   a pusher slidably guided by the pusher guides and having an insertion slot between the pusher guides for receiving the test object;
   a base coupled with at least one of the substrate and the inner frame;
   an operating member rotatably held by the base and having one end engaged with the pusher;
   a first elastic member for continuously urging the operating member in a pushing direction of the pusher; and
   a second elastic member for continuously urging the pusher in a direction opposite to the pushing direction, the pusher guides and the pusher cooperating with each other to position the test object inserted in the insertion slot at a first position facing the connector, and the pusher being pushed towards the pushing direction by the operating member urged by the first elastic member, and moving against the second elastic member, together with the insertion slot to carry the test object inserted in the insertion slot, from the first position to a second position where the test object is brought into contact with the connector.

2. The test apparatus according to claim 1, further comprising a support member with the substrate placed thereon, the base being fixed to the support member.

3. The test apparatus according to claim 2, wherein the inner frame is disposed between the support member and the base and fixed to the support member.

4. The test apparatus according to claim 2, wherein the substrate is disposed between the support member and the base and fixed to the support member.

5. The test apparatus according to claim 1, wherein the connector comprises:
   an elastic layer;
   a film sandwiching the elastic layer; and
   a conductor formed on a surface of the film.

6. The test apparatus according to claim 5, wherein the connector further comprises a core member holding the elastic layer, the core member being held by the inner frame.

7. The test apparatus according to claim 6, wherein the core member has a hole, the inner frame having a protrusion inserted through the hole, the substrate having a fitting hole fitted over the protrusion.

8. The test apparatus according to claim 2, wherein the base and the support member have recessed structures fittable to either bolts or nuts.

* * * * *